(12) United States Patent
Lin

(10) Patent No.: US 9,419,162 B2
(45) Date of Patent: Aug. 16, 2016

(54) ARRAY SENSOR APPARATUS AND FORMING METHOD THEREOF

(71) Applicant: Shanghai Oxi Technology Co., Ltd, Shanghai (CN)

(72) Inventor: Weiping Lin, Shanghai (CN)

(73) Assignee: Shanghai Oxi Technology Co., Ltd. (CN)

( * ) Notice: Subject to any disclaimer, the term of this patent is extended or adjusted under 35 U.S.C. 154(b) by 0 days.

(21) Appl. No.: 14/493,948

(22) Filed: Sep. 23, 2014

(65) Prior Publication Data

US 2015/0371075 A1 Dec. 24, 2015

(30) Foreign Application Priority Data

Jun. 23, 2014 (CN) .......................... 2014 1 0284272

(51) Int. Cl.
| | | |
|---|---|---|
| G06K 9/00 | (2006.01) | |
| H01L 31/0216 | (2014.01) | |
| H01L 31/0368 | (2006.01) | |
| H01L 31/032 | (2006.01) | |
| H01L 31/028 | (2006.01) | |
| H01L 31/0376 | (2006.01) | |
| H01L 27/146 | (2006.01) | |

(52) U.S. Cl.
CPC ........ *H01L 31/03682* (2013.01); *G06K 9/0002* (2013.01); *G06K 9/00053* (2013.01); *H01L 27/14678* (2013.01); *H01L 27/14692* (2013.01); *H01L 31/028* (2013.01); *H01L 31/02164* (2013.01); *H01L 31/032* (2013.01); *H01L 31/03762* (2013.01)

(58) Field of Classification Search
CPC ................... H01L 27/14678; H01L 31/03682; H01L 31/02164; H01L 31/032; H01L 31/028; H01L 27/14692; G06K 9/0004; G06K 9/0002; G06K 9/00053
See application file for complete search history.

(56) References Cited

U.S. PATENT DOCUMENTS

| | | | | |
|---|---|---|---|---|
| 6,087,648 | A | * | 7/2000 | Zhang ................. G02F 1/13454 250/208.1 |
| 6,688,186 | B2 | * | 2/2004 | Chae .................... G06K 9/0004 257/E27.111 |
| 2002/0074551 | A1 | * | 6/2002 | Kimura ............... G02F 1/13454 257/72 |
| 2008/0084365 | A1 | * | 4/2008 | Takahara ............... G09G 3/006 345/76 |
| 2014/0035895 | A1 | * | 2/2014 | Toyomura ............ G09G 3/3611 345/211 |

* cited by examiner

*Primary Examiner* — Yuanda Zhang
*Assistant Examiner* — Michael Carter
(74) *Attorney, Agent, or Firm* — Swanson & Bratschun, L.L.C.

(57) ABSTRACT

An array sensor apparatus and forming method thereof, wherein the array sensor comprises: a driving circuit and a sensor circuit, wherein the driving circuit and the sensor circuit are formed on the same substrate surface, the sensor circuit comprises a pixel cell array including pixel cells and driving lines connected with the pixel cells, output ends of the driving circuit are connected to the driving lines of the sensor circuit, the driving circuit comprises a first transistor, and the pixel cell comprises a second transistor. In the array sensor apparatus of the present disclosure, the driving circuit and the sensor circuit are formed on the same substrate surface, thus occupying less area. Reliability may be improved. Besides, the forming processes can be implemented simultaneously without additional processing steps.

11 Claims, 5 Drawing Sheets

ARRAY SENSOR APPARATUS AND FORMING METHOD THEREOF

CROSS-REFERENCE TO RELATED APPLICATIONS

The present application claims priority to Chinese patent application No. 201410284272.9, filed on Jun. 23, 2014, and entitled "ARRAY SENSOR APPARATUS AND FORMING METHOD THEREOF", the entire disclosure of which is incorporated herein by reference.

TECHNICAL FIELD

The present disclosure generally relates to sensors, and more particularly, to an array sensor apparatus for detecting fingerprint and forming method thereof.

BACKGROUND

Array sensors are large-sized planar imaging devices, which may include pixel cell arrays, driving lines, signal reading lines and the like. In an array sensor, optical signals containing image information are directly projected onto pixel cells on a sensor imaging surface, and thus being converted by the pixel cells for creating an image. As the imaging process is implemented without using a lens or optical fibers to focus the light beams, no scaling occurs and an image obtained from this process can reflect the object in its original size. In such way, image quality can be improved. Besides, imaging devices using array sensors can be made thinner and lighter, so they are already widely used in various industrial fields.

For example, array sensor devices can be used for fingerprint imaging, file scanning, etc. As shown in FIG. 1, visible lights from a backside of an array sensor 11 irradiate onto an object 13 closely attached to an imaging surface of the array sensor 11. The visible lights may be reflected and refracted on an interface between the array sensor 11 and the object 13. Then the visible lights being reflected by the object 13 will be transmitted to pixel cells of the array sensor 11.

As shown in FIG. 2, each pixel cell includes a switching element 111 and a photoelectric element 112. The visible lights are converted into electric signals by the photoelectric element 112 in the pixel cells of the array sensor 11, and the electric signals are stored therein. A system controller 14 controls driving chips 151 of driving units 15 to control driving lines 113 of the array sensor 11, so as to activate the pixel cell array row by row. Furthermore, the system controller 14 controls signal reading chips 161 of signal sampling units 16 to read electric signals from the currently activated row in the pixel cell array through signal lines 114 of the array sensor 11. Thereafter, the electric signals are subjected to amplification and analog-digital conversion, and data resulting from these processing will be stored. As such, a digital gray scale image reflecting surface features of the object 13 being irradiated can be obtained.

The array sensor 11 generally has a glass substrate. Techniques such as Physical Vapor Deposition (PVD), Plasma Enhanced Chemical Vapor Deposition (PECVD), dry etch, wet etch and the like may be used to form one or more thin films on the glass substrate, thereby constituting electrical and optical elements for implementing various functions, and forming conducting lines. These thin films may include one or more conducting layers, insulating layers and protective layers.

Referring still to FIG. 2, in existing products, the driving chips 151 are bonded on a soft conductive film using a Chip On Film (COF) method or the like, which forms a COF module. Then the COF module is bonded to a corresponding position on the array sensor 11 using a Film On Glass (FOG) method. Therefore, driving lines 113 of the array sensor 11 are connected and electrically coupled to the driving chips 151. However, such bonding modes bring complex connecting paths between the system controller 14 and the driving lines 113 of the array sensor 11, which may reduce the reliability and occupy more areas.

SUMMARY

According to one embodiment, an array sensor is provided, including: a driving circuit and a sensor circuit, wherein the driving circuit and the sensor circuit are formed onto a same substrate surface, the sensor circuit includes a pixel cell array which contains pixel cells and driving lines coupling to the pixel cells, output ends of the driving circuit connect to the driving lines of the sensor circuit, the driving circuit includes a first transistor, and the pixel cell includes a second transistor;

wherein the first transistor includes: a first conductive layer located on the substrate surface; a first insulating layer overlaying the first conductive layer; a first semiconductor layer located on a surface of the first insulating layer and having a position corresponding to that of the first conductive layer; a second conductive layer overlaying the first semiconductor layer, wherein the second conductive layer has a first opening which partially exposes a surface of the first semiconductor layer; a second insulating layer overlaying the second conductive layer and filling up the first opening; and a first barrier layer located on a surface of the second insulating layer and having a position corresponding to that of the first opening; and wherein the second transistor includes: a third conductive layer located on the substrate surface; a third insulating layer overlaying the third conductive layer; a second semiconductor layer located on a surface of the third insulating layer and having a position corresponding to that of the third conductive layer; a forth conductive layer overlaying the second semiconductor layer, wherein the forth conductive layer has a second opening which partially exposes a surface of the second semiconductor layer; a forth insulating layer overlaying the forth conductive layer and filling up the second opening; and a second barrier layer located on a surface of the forth insulating layer and having a position corresponding to that of the second opening.

According to one embodiment, a method for forming the array sensor as recited above is provided, including:

providing a substrate;

forming a first conductive layer and a third conductive layer on a surface of the substrate;

forming a first insulating layer and a third insulating layer, wherein the first insulating layer overlays the first conductive layer, and the third insulating layer overlays the third conductive layer;

forming a first semiconductor layer on a surface of the first insulating layer and a second semiconductor layer on a surface of the third insulating layer, wherein position of the first semiconductor corresponds to position of the first conductive layer, and position of the second semiconductor corresponds to position of the third conductive layer;

forming a second conductive layer overlaying the first semiconductor layer and a forth conductive layer overlaying the second semiconductor layer;

forming a first opening in the second conductive layer and a second opening in the forth conductive layer, wherein the first opening partially exposes a surface of the first semiconductor layer, and the second opening partially exposes a surface of the second semiconductor layer;

forming a second insulating layer and a forth insulating layer, wherein the second insulating layer overlays the second conductive layer and fills up the first opening, and the forth insulating layer overlays the forth conductive layer and fills up the second opening; and forming a first barrier layer on a surface of the second insulating layer and a second barrier layer on a surface of the forth insulating layer, wherein position of the first barrier layer corresponds to position of the first opening, and position of the second barrier layer corresponds to position of the second opening.

In comparison with the prior art, the array sensor apparatus provided in embodiments of the present disclosure have a driving circuit and a sensor circuit formed onto the same substrate, thus less area may be occupied and reliability may be improved. Besides, the formations of the driving circuit and the sensor circuit can be implemented simultaneously without adding extra processing steps.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 1:
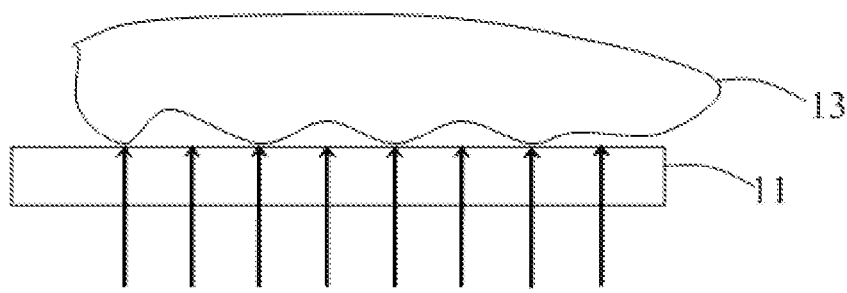
FIG. 1 schematically illustrates an operation model of an existing array sensor.
Figure 2:
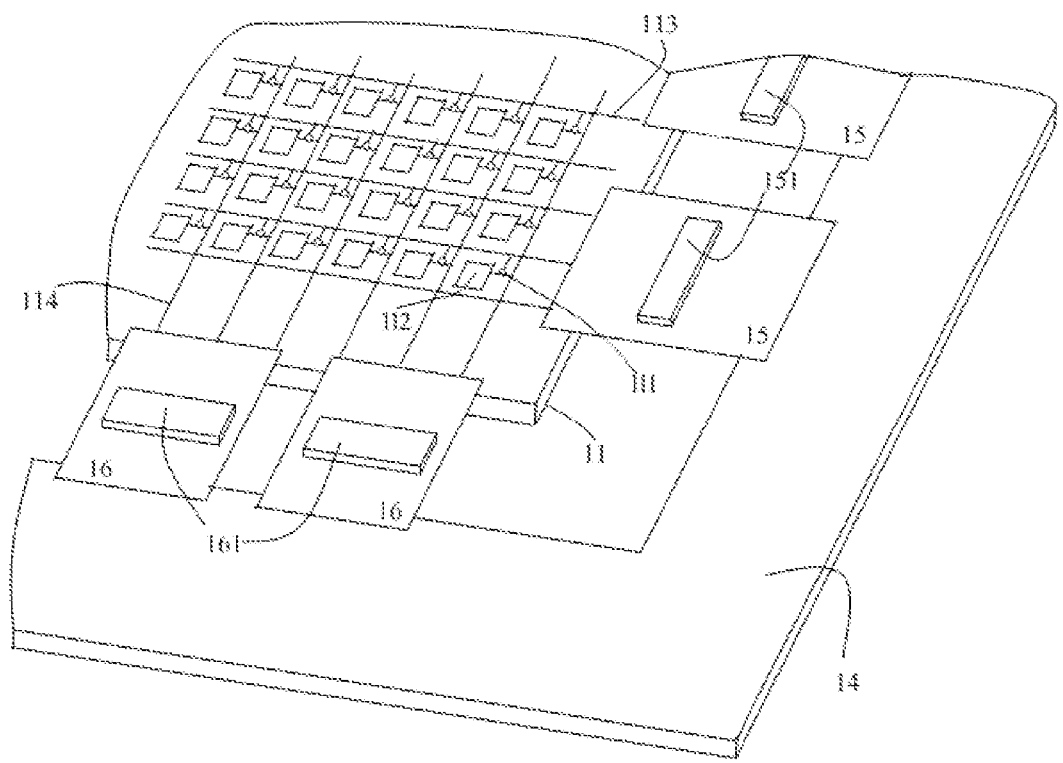
FIG. 2 schematically illustrates a structure of the existing array sensor.
Figure 3:
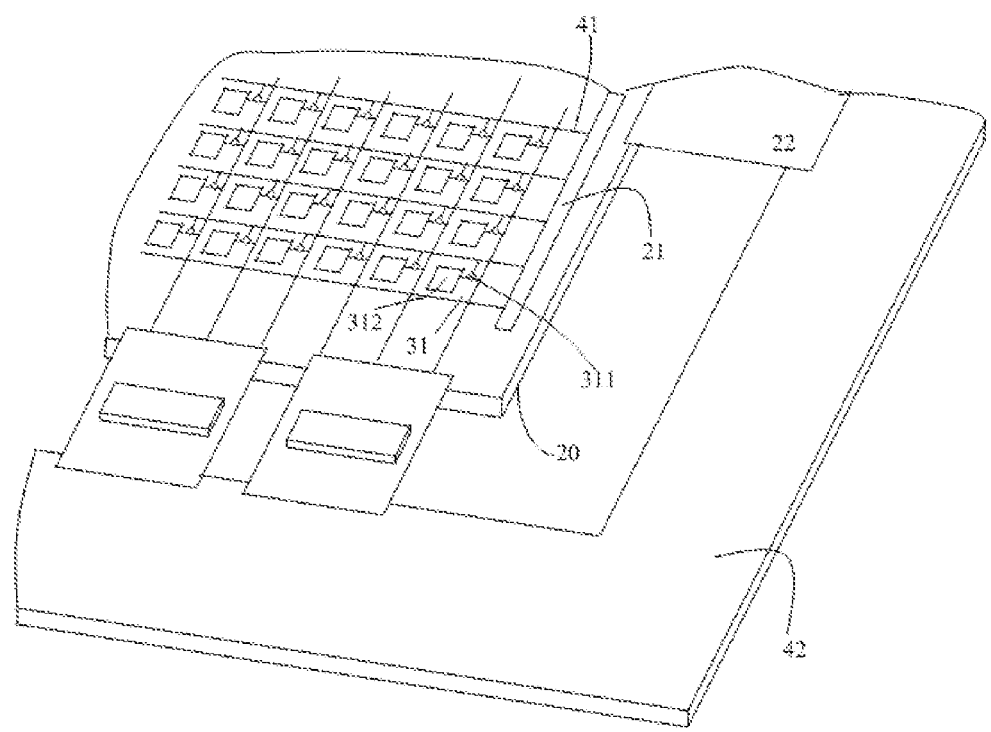
FIG. 3 schematically illustrates a structure of an array sensor according to one embodiment of the present disclosure.

As shown in FIG. 3, one embodiment of the present disclosure provides an array sensor apparatus which includes a driving circuit 21 and a sensor circuit. The sensor circuit includes a pixel cell array and driving lines 41. The pixel cell array includes pixel cells 31, and the driving lines 41 are connected with the pixel cells 31. The pixel cell 31 includes a second transistor 311 and a photoelectric device 312. The second transistor 311 severs as a switching device and connects with a corresponding driving line 41. The pixel driving circuit 21 is adapted to enabling the pixel cell array row by row.

Figure 4:
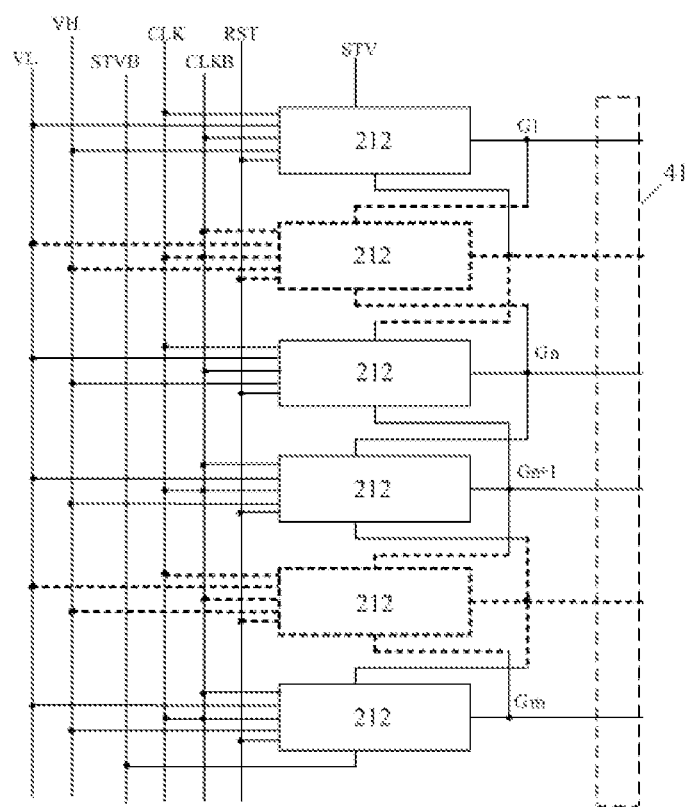
FIG. 4 schematically illustrates a structure of a driving circuit according to one embodiment of the present disclosure.

As shown in FIG. 4, according to one embodiment of the present disclosure, there is provided details of the driving circuit 21. The driving circuit 21 includes a plurality of elementary shifting units 212 whose number is m. An output terminal G1 of the first elementary shifting unit 212 . . . an output terminal Gn of the $n^{th}$ elementary shifting unit 212, an output terminal Gn+1 of the $(n+1)^{th}$ elementary shifting unit 212 . . . and an output terminal Gm of the $m^{th}$ elementary shifting unit 212 are respectively coupled to corresponding driving lines 41. First power supply terminals of all elementary shifting units 212 are adapted to receiving a high level signal VH, second power supply terminals of all elementary shifting units 212 are adapted to receiving a low level signal VL, first clock terminals of all elementary shifting units 212 are adapted to receiving a first clock signal CLK, second clock terminals of all elementary shifting units 212 are adapted to receiving a second clock signal CLKB, and reset terminals of all elementary shifting units 212 are adapted to receiving a reset signal RST. A first trigger terminal of the first elementary shifting unit 212 is adapted to receiving a first trigger signal STV, while a second trigger terminal of the $m^{th}$ elementary shifting unit 212 is adapted to receiving a second trigger signal STVB. The first trigger terminal of the $p^{th}$ ($2 \leq p \leq m$) elementary shifting unit 212 is connected with the output terminal of the $(p-1)^{th}$ elementary shifting unit 212, the output terminal of the $p^{th}$ elementary shifting unit 212 is connected with the second trigger terminal of the $(p-1)^{th}$ elementary shifting unit 212. It should be noted that, the driving circuit 21 may be implemented in other forms.

Figure 5:
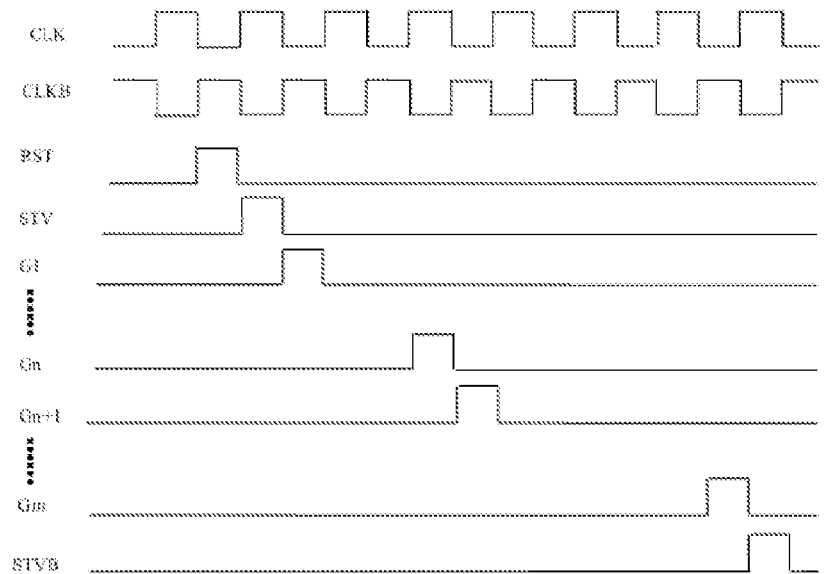
FIG. 5 schematically illustrates signal waveforms according to one embodiment of the present disclosure.

As shown in FIG. 5, the first clock signal CLK and the second clock signal CLKB are both pulse mode clock signals and they are inversion signals with respect to each other. In the meanwhile of outputting a signal to the corresponding driving line 41, each elementary shifting unit 212 also switches off the output of the previous elementary shifting unit 212 and triggers the output of the following elementary shifting unit 212. The first trigger signal STV is used to enable the first elementary shifting unit 212 to output, while the second trigger signal STVB is used to switch off the last elementary shifting unit 212. Under control of the above recited signals, the elementary shifting units 212 output enabling signals to the driving lines 41 in sequence, so as to activate the pixel cell array row by row.

Figure 6:
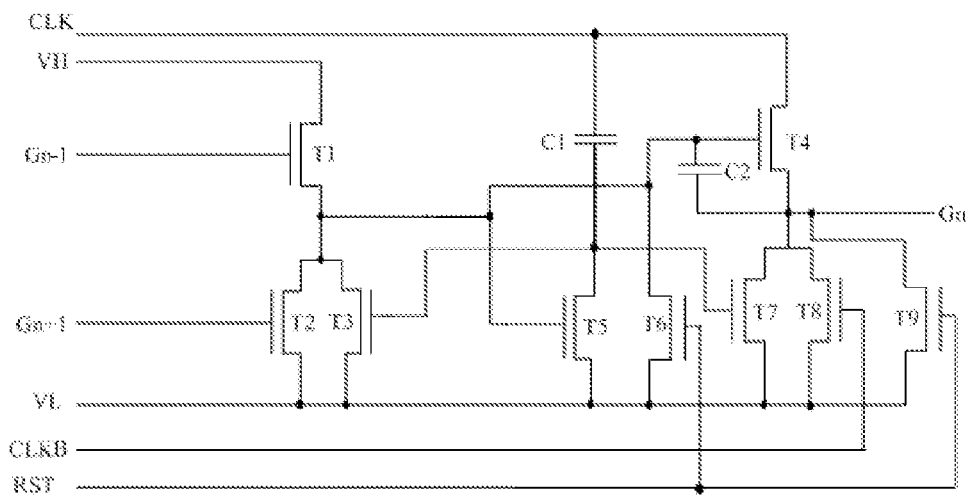
FIG. 6 schematically illustrates a structure of a elementary shifting unit according to one embodiment of the present disclosure.

As shown in FIG. 6, according to one embodiment, details of the elementary shifting unit 212 are illustrated. Taking the $n^{th}$ elementary shifting unit 212 as an example, the $n^{th}$ elementary shifting unit 212 includes nine first transistors, one first capacitor C1 and one second capacitor C2. The nine first transistors are noted as: a $1^{st}$ first transistor T1, a $2^{nd}$ first transistor T2, a $3^{rd}$ first transistor T3, a $4^{th}$ first transistor T4, a $5^{th}$ first transistor T5, a $6^{th}$ first transistor T6, a $7^{st}$ first transistor T7, a $8^{st}$ first transistor T8 and a $9^{st}$ first transistor T9. It should be noted that, the elementary shifting unit 212 may have other configurations.

A first terminal of the $1^{st}$ first transistor T1 is adapted to receiving the high level signal VH. A second terminal of the $1^{st}$ first transistor T1 is connected with a first terminal of the $2^{nd}$ first transistor T2, a first terminal of the $3^{rd}$ first transistor T3, a third terminal of the $5^{th}$ first transistor T5, a first terminal of the $6^{th}$ first transistor T6, a third terminal of the $4^{th}$ first transistor T4 and a first terminal of the second capacitor C2. And a third terminal the $1^{st}$ first transistor T1 is connected with the output terminal Gn-1 of the $(n-1)^{th}$ elementary shifting unit 212.

A second terminal of the $2^{nd}$ first transistor T2 is adapted to receiving the low level signal VL. And a third terminal of the $2^{nd}$ first transistor T2 is connected with the output terminal Gn+1 of the $(n+1)^{th}$ elementary shifting unit 212.

A second terminal of the $3^{rd}$ first transistor T3 is adapted to receiving the low level signal VL. And a third terminal of the $3^{rd}$ first transistor T3 is connected with a first terminal of the $5^{th}$ first transistor T5, a third terminal of the $7^{th}$ first transistor T7 and a second terminal of the first capacitor C1.

A first terminal of the $4^{th}$ first transistor T4 is connected with a first terminal of the first capacitor C1 and is adapted to receiving the first clock signal CLK. And a second terminal of the $4^{th}$ first transistor T4 is connected with a second terminal of the second capacitor C2, a first terminal of the $7^{th}$ first transistor T7, a first terminal of the $8^{th}$ first transistor T8, a first terminal of the $9^{th}$ first transistor T9 and a $n^{th}$ driving line.

A second terminal of the $5^{th}$ first transistor T5 is adapted to receiving the low level signal VL.

A second terminal of the $6^{th}$ first transistor T6 is adapted to receiving the low level signal VL. And a third of the $6^{th}$ first transistor T6 is adapted to inputting the reset signal RST.

A second terminal of the $7^{th}$ first transistor T7 is adapted to receiving the low level signal VL.

A second terminal of the $8^{th}$ first transistor T8 is adapted to receiving the low level signal VL. And a third terminal of the $8^{th}$ first transistor T8 is adapted to inputting the second clock signal CLKB.

A second terminal of the $9^{th}$ first transistor T9 is adapted to receiving the low level signal VL. And a third terminal of the $9^{th}$ first transistor T9 is adapted to inputting the reset signal RST.

The first terminal of the any one of first transistors, as recited above, may be a source while the second terminal thereof may be a drain, and the third terminal of the first transistor is a gate. In some embodiments, the first terminal of the first transistor may be a drain while the second terminal thereof may be a source. The first transistor may be an amorphous Silicon Thin Film Transistor (a-Si TFT), or a Low Temperature Poly Silicon Thin Film Transistor (LTPS TFT), and it also may be an Oxide Semiconductor Thin Film Transistor (OTFT).

Referring still to FIG. 3, in some embodiments, the driving circuit 21 and the sensor circuit are formed on the same surface of the substrate 20. More specifically, the nine first transistors along with the first capacitor C1, the second capacitor C2 and the second transistor of the pixel cell in the sensor circuit are formed on the same surface of the substrate 20, and the driving circuit 21 may be located on a periphery region of the pixel cell array. The substrate may be made of glass or any other transparent materials such as crystal, sapphire or the like. In some embodiments, if visible lights are irradiated from a top surface of the substrate, the substrate may be an opaque substrate made of stainless steel, aluminum, plastic or the like. The top surface of the substrate refers to a surface on which the driving circuit 21 and the sensor circuit are formed.

Figure 7:
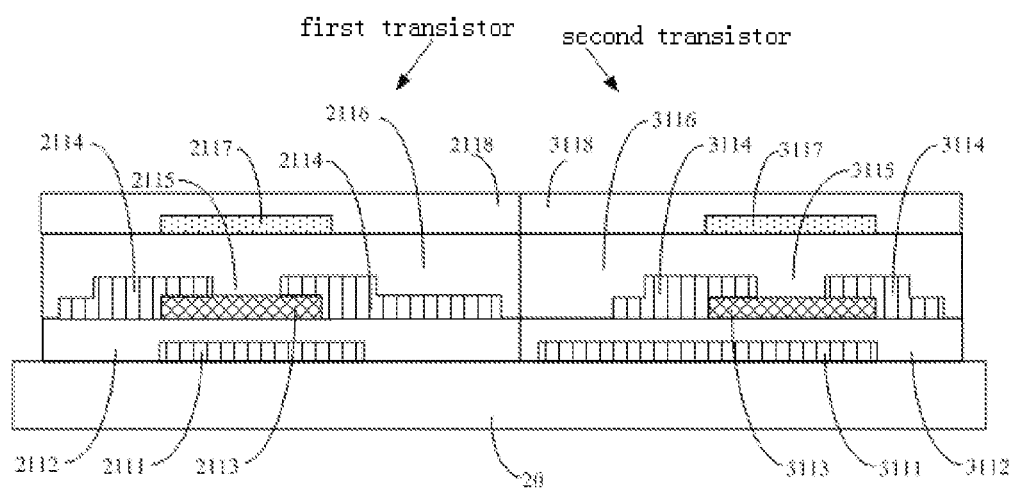
FIG. 7 is a cross-sectional diagram for illustrating a first transistor and a second transistor according to one embodiment of the present disclosure.

As shown in FIG. 7, the first transistor in the driving circuit 21 includes: a first conductive layer 2111 located on the substrate surface; a first insulating layer 2112 overlaying the first conductive layer 2111; a first semiconductor layer 2113 located on a surface of the first insulating layer and having a position corresponding to that of the first conductive layer 2111; a second conductive layer 2114 overlaying the first semiconductor layer 2113 and having a first opening 2115 which partially exposes a surface of the first semiconductor layer 2113; a second insulating layer 2116 overlaying the second conductive layer 2114 and filling up the first opening 2115; and a first barrier layer 2117 located on a surface of the second insulating layer 2116 and having a position corresponding to that of the first opening 2115. "Overlaying" as recited herein means covering a top surface and sidewalls of the object being overlaid. For example, the first insulating layer 2112 covers the top surface and sidewalls of the first conductive layer 2111.

The first barrier layer 2117 is made of a light-block conductive material which may be aluminum, molybdenum, aluminum neodymium (AlNd) alloy or other alloy metals, or may have a multi-layer structure including different materials.

The first conductive layer 2111 and the second conductive layer 2114 may be made of aluminum, molybdenum, aluminum neodymium alloy or other alloy metals, or may have a multi-layer structure including different materials. If visible lights are irradiated from the top surface of the substrate, the first conductive layer 2111 and the second conductive layer 2114 may be transparent conductive layers made of indium tin oxide (ITO) or the like. The first conductive layer 2111 servers as a gate of the first transistor. The second conductive layers 2114 located on two sides of the first semiconductor layer 2113 server as a source and a drain of the first transistor, respectively.

The first insulating layer 2112 and the second insulating layer 2116 may be made of silicon nitride (SiNx) or silicon oxide (SiOx).

The first semiconductor layer 2113 may be made of amorphous silicon, low temperature poly-silicon or semiconductor oxide.

A part of the first semiconductor layer 2113 corresponding to the first opening 2115 can be taken as a channel of the first transistor. The first semiconductor layer 2113 is able to accumulate free electrons when the first conductive layer 2111 is connected with a high level voltage, thus the first semiconductor layer 2113 is switched on. When a voltage difference is formed between the two parts of the second conductive layer 2114 located on two sides of the first semiconductor layer 2113, the free electrons accumulated in the first semiconductor layer 2113 is able to flow, such that the two parts of the second conductive layer 2114 are electrically connected. When the first conductive layer 2111 is connected with a low level voltage, there is no free electron gathered in the first semiconductor layer 2113, thus the first semiconductor layer 2113 is switched off. In such condition, even a voltage difference is formed between the two parts of the second conductive layer 2114, the first semiconductor layer 2113 is unable to electrically connect the two parts. Furthermore, if the first semiconductor layer 2113 receives optical signals, free electrons can be generated therein, which may result in that the two parts of the second conductive layer 2114 is always electrically connected or short through the first semiconductor layer 2113. As a result of that, signal charge will be lost. In such condition, the apparatus can not be controlled by controlling the voltage applied to the first conductive layer 2111. Therefore, in some embodiments, the first barrier layer 2117 is made of light-block material for preventing the optical signals received by the sensor in operation mode from entering into the first semiconductor layer 2113, so as to make sure that the sensor apparatus outputs correct signals. In order to give a better sheltering effect to the first semiconductor layer 2113, the first barrier layer 2117 shall be larger than the exposed part of the first semiconductor layer 2113 through the first opening 2115.

The second transistor of the pixel cell in the sensor circuit includes: a third conductive layer 3111 located on the substrate surface; a third insulating layer 3112 overlaying the third conductive layer 3111; a second semiconductor layer 3113 located on a surface of the third insulating layer 3112 and having a position corresponding to that of the third conductive layer 3111; a forth conductive layer 3114 overlaying the second semiconductor layer 3113 and having a second opening 3115 which partially exposes a surface of the second semiconductor layer 3113; a forth insulating layer 3116 overlaying the forth conductive layer 3114 and filling up the second opening 3115; and a second barrier layer 3117 located on a surface of the forth insulating layer 3116 and having a position corresponding to that of the second opening 3115.

The second barrier layer 3117 is made of a light-block conductive material which may be aluminum, molybdenum, aluminum neodymium (AlNd) alloy or other alloy metals with thickness ranging from 20 nm to 300 nm, or may have a multi-layer structure including different materials.

The third conductive layer 3111 and the forth conductive layer 3114 may be made of aluminum, molybdenum, aluminum neodymium alloy or other alloy metals, or may have a multi-layer structure including different materials. If visible lights are irradiated from the top surface of the substrate, the third conductive layer 3111 and the forth conductive layer 3114 may also be transparent conductive layers made of indium tin oxide (ITO) or the like. The third conductive layer 3111 servers as a gate of the second transistor, the forth conductive layers 2114 located on two sides of the third semiconductor layer 3113 server as a source and a drain of the second transistor, respectively.

The third insulating layer 3112 and the forth insulating layer 3116 may be made of silicon nitride (SiNx) or silicon oxide (SiOx).

The second semiconductor layer 3113 may be made of amorphous silicon, low temperature poly-silicon or oxide semiconductor. Function of the second barrier layer 3117 is similar to that of the first barrier layer 2117, which is to prevent the second semiconductor layer 3113 from being conductive all the time after it receives optical signals. A part of the second semiconductor layer 3113, which corresponds to the second opening 3115, serves as a channel of the second transistor.

Alternatively, the array sensor apparatus may include a first protecting layer 2118 overlaying the first barrier layer 2117, and a second protecting layer 3118 overlaying the second barrier layer 3117. The first protecting layer 2118 and the second protecting layer 3118 may be made of silicon nitride or silicon oxide.

In some embodiments, the first conductive layer 2111 and the third conductive layer 3111 are formed in a same processing step; the first insulating layer 2112 and the third insulating layer 3112 are formed in a same processing step; the first semiconductor layer 2113 and the second semiconductor layer 3113 are formed in a same processing step; the second conductive layer 2114 and the forth conductive layer 3114 are formed in a same processing step; the first opening 2115 and the second opening 3115 are formed in a same processing step; the second insulating layer 2116 and the forth insulating layer 3116 are formed in a same processing step; and the first barrier layer 2117 and the second barrier layer 3117 are formed in a same processing step.

More specifically, in one embodiment, there is also provided a method of forming an array sensor apparatus, including:

step S1: providing a substrate;
step S2: forming a first conductive layer and a third conductive layer on a surface of the substrate;
step S3: forming a first insulating layer and a third insulating layer, wherein the first insulating layer overlays the first conductive layer, and the third insulating layer overlays the third conductive layer;
step S4: forming a first semiconductor layer on a surface of the first insulating layer and a second semiconductor layer on a surface of the third insulating layer, wherein the first semiconductor has a position corresponding to that of the first conductive layer, and the second semiconductor has a position corresponding to that of the third conductive layer;
step S5: forming a second conductive layer and a forth conductive layer, wherein the second conductive layer overlays the first semiconductor layer, and the forth conductive layer overlays the second semiconductor layer;
step S6: forming a first opening in the second conductive layer and a second opening in the forth conductive layer, wherein the first opening partially exposes a surface of the first semiconductor layer, and the second opening partially exposes a surface of the second semiconductor layer;
step S7: forming a second insulating layer and a forth insulating layer, wherein the second insulating layer overlays the second conductive layer and fills up the first opening, and the forth insulating layer overlays the forth conductive layer and fills up the second opening; and
step S8: forming a first barrier layer on a surface of the second insulating layer and a second barrier layer on a surface of the forth insulating layer, wherein the first barrier layer has a position corresponding to that of the first opening, and the second barrier layer has a position corresponding to that of the second opening.

The step S2 may include: forming a first conductive thin film on the surface of the substrate, and etching the first conductive thin film so as to form the first conductive layer and the third conductive layer.

The step S3 may include: depositing a first insulating thin film on the first conductive layer and the third conductive layer so as to form the first insulating layer and the third insulating layer which are connected as an integral structure.

The step S4 may include: depositing a first semiconductor thin film on the first insulating layer and the third insulating layer, and etching the first semiconductor thin film at positions according to the first conductive layer and the third conductive layer, so as to form the first semiconductor layer and the second semiconductor layer.

The step S5 may include: depositing a second conductive thin film on the first semiconductor layer and the second semiconductor layer, and etching the second conductive thin film so as to form the second conductive layer and the forth conductive layer. The second conductive layer and the forth conductive layer are not connected with each other.

The step S6 may include: etching the second conductive layer so as to form the first opening, and etching the forth conductive layer so as to form the second opening.

The step S7 may include: depositing a second insulating thin film on the second conductive layer and the forth conductive layer to form the second insulating layer and the forth insulating layer which are connected as an integral structure.

The step S8 may include: depositing a first barrier thin film on positions corresponding to the first opening and the second opening so as to form the first barrier layer and the second barrier layer.

The first protecting layer 2118 and the second protecting layer 3118 also may be formed in a same process step, which is similar to the formation of the first insulating layer and the third insulating layer, so the details will not be described here.

When the first transistor in the driving circuit and the second transistor in the pixel cell are electrically connected, the array sensor apparatus may further include a conductive plug, wherein a first surface of the conductive plug contacts with the second conductive layer, and a second surface of the conductive plug contacts with the third conductive layer.

Figure 8:
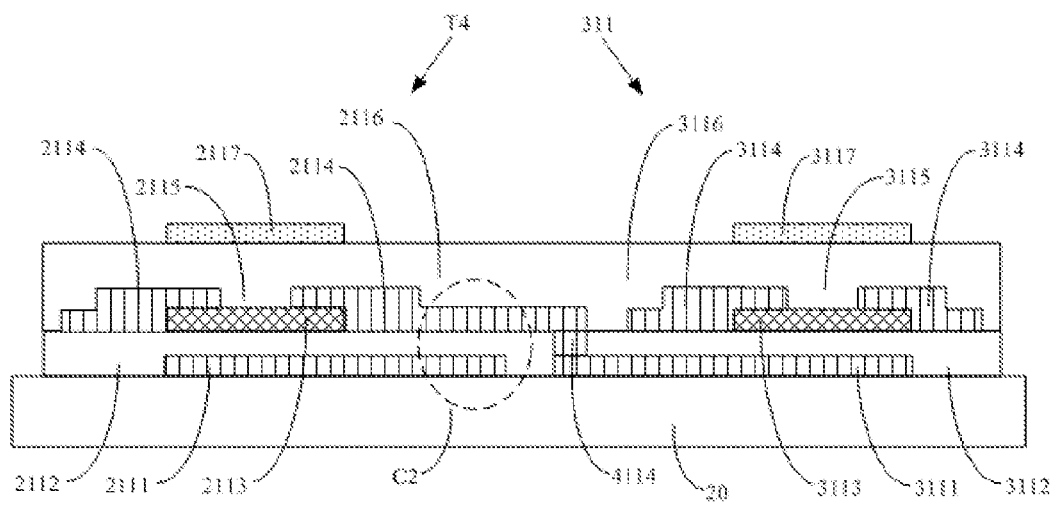
FIG. 8 is a cross-sectional diagram for illustrating a first transistor and a second transistor according to another embodiment of the present disclosure.

FIG. 8 provides a diagram illustrating structures of the 4$^{th}$ first transistor T4, the second capacitor C2 and the second transistor 311, and their connecting relations. The first surface of a conductive plug 4114 is connected with the second conductive layer 2114, and the second surface of the conductive plug 4114 is connected with the third conductive layer 3111. Corresponding parts of the second conductive layer 2114 and the first conductive layer 2111 constitute the second capacitor C2.

A method of forming the conductive plug 4114 includes: etching the third insulating layer 3112 after the third insulating layer is formed so as to form a third opening, wherein the third opening partially exposes a surface of the third conductive layer 3111; and filling up the third opening with conductive material so as to form the conductive plug 4114. Thus the second surface of the conductive plug 4114 contacts with the third conductive layer 3111. In the process of forming the second conductive layer 2114, the second conductive layer 2114 is formed to be in contact with the first surface of the conductive plug 4114. In such way, the source or the drain of the 4$^{th}$ first transistor is connected with the gate of the second transistor 311.

Referring still to FIG. 3, in the array sensor apparatus provided in some embodiments, the driving circuit is able to be produced in the same process with elements of the sensor circuit, without adding extra processing steps. The driving circuit only needs to be electrically connected to a system controller 42 through a soft connector 22, such that the system controller 42 can drive the driving lines 41 of the sensor circuit. Therefore, manufacturing costs may be reduced, integration may be increased, reliability and the yield may be improved as well.

In some embodiments, the first barrier layers 2117 of all the first transistors can be connected together, and then to be connected with a fixed potential such as the low level signal VL or the high level signal VH. The first barrier layer 2117 in the first transistor is also able to be connected with the second barrier layer 3117, and then to be connected to a fixed potential such as the low level signal VL or the high level signal VH. Connecting the first barrier layer and the second barrier layer to the fixed potential may prevent breaking down the second insulating layer 2116 and the forth insulating layer 3116 due to the static electricity collection generated in the producing process of the first barrier layer and the second barrier layer.

The disclosure is disclosed, but not limited, by preferred embodiments as above. Based on the disclosure of the disclosure, those skilled in the art can make any variation and modification without departing from the scope of the disclosure. Therefore, protection scope of the disclosure is defined by claims.

What is claimed is:

1. An array sensor, comprising:
    a driving circuit and a sensor circuit, wherein the driving circuit and the sensor circuit are configured onto a same substrate surface, the sensor circuit comprises a pixel cell array comprising pixel cells and driving lines connected with the pixel cells, output ends of the driving circuit are connected to the driving lines of the sensor circuit, the driving circuit comprises a first transistor, and the pixel cell comprises a second transistor;
    wherein the first transistor comprises:
        a first conductive layer located on the substrate surface;
        a first insulating layer overlaying the first conductive layer;
        a first semiconductor layer located on a surface of the first insulating layer, wherein position of the first semiconductor corresponds to position of the first conductive layer;
        a second conductive layer overlaying the first semiconductor layer, wherein the second conductive layer has a first opening which partially exposes a surface of the first semiconductor layer;
        a second insulating layer overlaying the second conductive layer and filling up the first opening; and
        a first barrier layer located on a surface of the second insulating layer, wherein position of the first barrier layer corresponds to position of the first opening;
    and wherein the second transistor comprises:
        a third conductive layer located on the substrate surface;
        a third insulating layer overlaying the third conductive layer;
        a second semiconductor layer located on a surface of the third insulating layer, wherein position of the second semiconductor layer corresponds to position of the third conductive layer;
        a fourth conductive layer overlaying the second semiconductor layer, wherein the fourth conductive layer has a second opening which partially exposes a surface of the second semiconductor layer;
        a fourth insulating layer overlaying the fourth conductive layer and filling up the second opening;
        a second barrier layer located on a surface of the fourth insulating layer, wherein position of the second barrier layer corresponds to position of the second opening; and
        a conductive plug located in the third insulating layer, wherein a first surface of the conductive plug contacts with the second conductive layer, and a second surface of the conductive plug contacts with the third conductive layer.

2. The array sensor according to claim 1, wherein the driving circuit is located on a periphery region of the pixel cell array.

3. The array sensor according to claim 1, wherein the first barrier layer and the second barrier layer both comprise a light-block material.

4. The array sensor according to claim 1, wherein the first semiconductor layer comprises amorphous silicon, low temperature poly-silicon or oxide semiconductor, and the second semiconductor layer comprises amorphous silicon, low temperature poly-silicon or oxide semiconductor.

5. The array sensor according to claim 1, further comprising a system controller and a soft connector, wherein the driving circuit is electrically connected with the system controller through the soft connector.

6. An array sensor, comprising:
    a driving circuit and a sensor circuit, wherein the driving circuit and the sensor circuit are configured onto a same substrate surface, the sensor circuit comprises a pixel cell array comprising pixel cells and driving lines connected with the pixel cells, output ends of the driving circuit are connected to the driving lines of the sensor circuit, the driving circuit comprises a first transistor, and the pixel cell comprises a second transistor;
    wherein the first transistor comprises:
        a first conductive layer located on the substrate surface;
        a first insulating layer overlaying the first conductive layer;

a first semiconductor layer located on a surface of the first insulating layer, wherein position of the first semiconductor corresponds to position of the first conductive layer;

a second conductive layer overlaying the first semiconductor layer, wherein the second conductive layer has a first opening which partially exposes a surface of the first semiconductor layer;

a second insulating layer overlaying the second conductive layer and filling up the first opening; and a first barrier layer located on a surface of the second insulating layer, wherein position of the first barrier layer corresponds to position of the first opening;

wherein the second transistor comprises:

a third conductive layer located on the substrate surface;

a third insulating layer overlaying the third conductive layer;

a second semiconductor layer located on a surface of the third insulating layer, wherein position of the second semiconductor layer corresponds to position of the third conductive layer;

a fourth conductive layer overlaying the second semiconductor layer, wherein the fourth conductive layer has a second opening which partially exposes a surface of the second semiconductor layer;

a fourth insulating layer overlaying the fourth conductive layer and filling up the second opening; and a second barrier layer located on a surface of the fourth insulating layer, wherein position of the second barrier layer corresponds to position of the second opening, and wherein the first barrier layer and the second barrier layer are both connected to a fixed electrical potential.

7. The array sensor according to claim 6, wherein the driving circuit is located on a periphery region of the pixel cell array.

8. The array sensor according to claim 6, further comprising a conductive plug located in the third insulating layer, wherein a first surface of the conductive plug contacts with the second conductive layer, and a second surface of the conductive plug contacts with the third conductive layer.

9. The array sensor according to claim 6, wherein the first barrier layer and the second barrier layer both comprise a light-block material.

10. The array sensor according to claim 6, wherein the first semiconductor layer comprises amorphous silicon, low temperature poly-silicon or oxide semiconductor, and the second semiconductor layer comprises amorphous silicon, low temperature poly-silicon or oxide semiconductor.

11. The array sensor according to claim 6, further comprising a system controller and a soft connector, wherein the driving circuit is electrically connected with the system controller through the soft connector.

* * * * *